United States Patent [19]

Schaffner et al.

[11] Patent Number: 5,404,006
[45] Date of Patent: Apr. 4, 1995

[54] HIGH POWER CAPACITY OPTICAL RECEIVER APPARATUS AND METHOD EMPLOYING DISTRIBUTED PHOTODETECTORS

[75] Inventors: James H. Schaffner, Chatsworth; Joseph L. Pikulski, Westlake; Robert Y. Loo, Los Angeles; Willie W. Ng, Agoura Hills, all of Calif.

[73] Assignee: Hughes Aircraft Company, Los Angeles, Calif.

[21] Appl. No.: 183,206

[22] Filed: Jan. 18, 1994

Related U.S. Application Data

[63] Continuation of Ser. No. 20,510, Feb. 22, 1993, abandoned.

[51] Int. Cl.$^6$ .............................................. H01J 40/14
[52] U.S. Cl. ............................. 250/208.2; 250/227.11
[58] Field of Search ............... 250/208.1, 208.2, 208.3, 250/214.1, 227.14, 227.11, 551; 359/189, 193, 195

[56] References Cited

U.S. PATENT DOCUMENTS

| | | | |
|---|---|---|---|
| 4,427,895 | 1/1984 | Eng | 250/551 |
| 4,870,295 | 9/1989 | Rauscher | 250/208.2 |
| 5,001,336 | 3/1991 | DeLaChapelle | |

OTHER PUBLICATIONS

Wang, *Introduction to Semiconductor Technology: GaAs and Related Compounds*, John Wiley & Sons, 1990, pp. 482–486.

Taylor et al., "Traveling Wave Photodetectors", *Optoelectronics Signal Processing for Phased-Array Antennas II*, SPIE vol. 1217, 1990, pp. 59–63.

Walker, "High-Speed III–V Semiconductor Intensity Modulators", IEEE *Journal of Quantum Electronics*, vol. 27, No. 3, Mar. 1991, pp. 654–667.

*Primary Examiner*—David C. Nelms
*Attorney, Agent, or Firm*—V. D. Duraiswamy; W. K. Denson-Low

[57] ABSTRACT

An optical receiver with an enhanced power capability and wide bandwidth is implemented by distributing a number of photodetectors along an optical transmission channel to convert respective portions of an optical signal into electrical signals. An electrical transmission line receives and accumulates signal inputs from the photodetectors. A velocity matching is established between the optical and electrical signals, allowing the photodetector outputs to accumulate coherently along the electrical transmission line, by loading the transmission line with distributed capacitance elements. The loading capacitances are preferably inherent in the photodetectors, which are designed and spaced apart from each other to yield the desired velocity matching. Possible photodetectors include p-i-n photodiodes with associated depletion layer capacitances, and metal-semiconductor-metal devices in which the capacitance is provided by interdigitated fingers that extend over an active optically absorbing layer on the waveguide from electrodes on either side.

18 Claims, 5 Drawing Sheets

HIGH POWER CAPACITY OPTICAL RECEIVER APPARATUS AND METHOD EMPLOYING DISTRIBUTED PHOTODETECTORS

This is a continuation of application Ser. No. 08/020,510, filed Feb. 22, 1993, now abandoned.

BACKGROUND OF THE INVENTION

1. Field of the Invention

This invention relates to optical receivers in which an array of discrete photodetectors is employed to sense an input optical signal.

2. Description of the Related Art

Microwave and millimeter wave photodetector receivers are limited in their optical collection areas by the required bandwidth of the system. This limitation stems from the RC time constants of the photodiodes that are typically used for optical reception, since the photodiode depletion region capacitance is directly proportional to the area of its p-n junction. Accordingly, the device area must be scaled down as the desired operational frequency increases. This, however, limits the amount of optical power that can be converted to electrical current by the receiver before the nonlinearity of the conversion process causes unacceptable signal distortion, or the detector itself burns out. Photodetector structures are well known and are described, for example, in Wang, *Introduction to Semiconductor Technology: GaAs and Related Compounds*, John Wiley & Sons, 1990, pages 482–486.

A photodetection system that purports to achieve higher power capabilities is described in Taylor et al., "Traveling Wave Photodetectors", *Optoelectronics Signal Processing for Phased-Array Antennas II*, SPIE Vol. 1217, 1990, pages 59–63. In this system an RF electrical transmission line is used as the electrode of an elongated photodetector. To obtain a velocity match between the RF electrical signal and the optical signal, it is suggested that a dielectric overlay be provided on top of the transmission line, or that the transmission line be buried in the GaAs substrate. The latter approach is said to be capable of achieving an almost perfect phase matching between the phase velocity of the electrical microwave signal $v_m$ and the optical group velocity $v_o$. However, in this reception system the electrical transmission line is an integral part of the optical detector, which prevents the transmission line from being optimized independent of the photodetector.

In De La Chapelle U.S. Pat. No. 5,001,336, issued Mar. 19, 1991, a number of different optical signals are summed electronically by a plurality of photodetectors connected in parallel. Although it is disclosed only in connection with the detection of a number of different optical signals, it might also be possible to use the system to sum portions of a single optical signal for increased optical power handling. However, the described receiver requires a separate optical fiber for each photodetector. Packaging the receiver would therefore be cumbersome, and the multitude of fiber optic pigtails that would be required would reduce the receiver's reliability. Furthermore, the length of each optical fiber would need to be precisely determined to preserve phase coherence between the RF signals from each detector.

A system that is used to modulate an optical signal with a modulating electrical input is described in Walker, "High-Speed III-V Semiconductor Intensity Modulators", *IEEE Journal of Quantum Electronics*, Vol. 27, No. 3, March 1991, pages 654–667. The system employs a loaded-line traveling-wave modulator in which an RF strip-line electrical transmission circuit is loaded with discrete printed circuit capacitors. The propagation of the electrical modulating signal is slowed so that it matches the propagation speed of the optical signal that is being modulated. The use of the velocity-matched structure is said to result in very high bandwidth-voltage ratios. However, the described system is for modulating, not receiving, optical signals.

SUMMARY OF THE INVENTION

The present invention seeks to provide an optical receiver apparatus and method that has a high power capacity, and yet is operable over a wide bandwidth that can include microwave and millimeter wave ranges.

These goals are accomplished by distributing a plurality of opto-electric photodetectors along an optical transmission channel to transduce respective portions of an optical signal that is propagated along the channel into respective electrical signals. An electrical transmission line receives and accumulates the distributed electrical inputs from the photodetectors. A velocity match is achieved between the optical signal in the optical channel and the accumulating electrical signal in the electrical transmission line by distributing a plurality of capacitance elements along the electrical line to slow down the electrical signal propagation along that line; the electrical inputs are mutually spaced along the transmission line and the capacitance elements are selected so that the electrical inputs accumulate coherently along the transmission line.

In one embodiment the photodetectors are implemented as p-i-n devices with associated depletion layer capacitances that function as the capacitance elements. The electrical transmission line is implemented as a microstrip RF line, with a set of microstrip stub lines that provide inputs to the RF line from the various photodetectors. The stub lines add to the capacitance provided by the photodetectors, and the spacing between photodetector inputs is adjusted to account for this added capacitance. Alternately, the photodetectors could be arranged to overlie the microstrip RF line, eliminating the need for the microstrip stubs. In either case, a controlled fraction of the optical signal can be coupled out to each of the photodetectors by means of diffraction gratings along the optical transmission channel.

In another embodiment, the optical transmission channel is implemented as an optical fiber in which the cladding is truncated along one side substantially to the level of the fiber's core. In this embodiment the photodetectors overlie the core on the truncated side of the cladding.

A third embodiment employs metal-semiconductor-metal photodetectors over an active waveguide layer. The photodetectors include opposed pairs of metal electrodes with interdigitated electrode fingers, with the number and configuration of the fingers determining the capacitance associated with each photodetector. The electrode fingers overlie an active absorbing layer into which a portion of the optical signal is coupled from the waveguide.

The optical coupling elements are preferably distributed along the optical channel to couple generally equal portions of the optical signal from the channel to the various photodetectors. The individual photodetector power capacities are effectively accumulated to establish a power capacity for the overall receiver greatly in excess of the capacity of any single one of the photodetectors. The receiver's power capacity thus varies with the aggregate junction area for all of its constituent photodetectors, while its bandwidth is limited by the much smaller area of an individual photodetector within the array.

Further features and advantages of the invention will be apparent to those skilled in the art from the following detailed description, taken together with the accompanying drawings.

DETAILED DESCRIPTION OF THE INVENTION

An important application of the present invention is in microwave analog fiber optic links. These high frequency systems consist of a transmitter that converts an RF (radio frequency) signal into a modulated (either AM or FM) optical signal, a length of optical fiber, and a receiver that converts the optical signal back into an RF signal. The receiver is typically a semiconductor photodiode, such as described in Liu et al., "Very-High-Bandwidth $In_{0.53}Ga_{0.47}$ As p-i-n Detector Arrays", *IEEE Photonics Technology Letters*, Vol. 3, No. 10, October 1991, pages 931–933. It is desirable that fiber optic links used in cable television and antenna remoting applications have a very large spur-free dynamic range, which is the relative suppression of the third-order, two-tone intermodulation distortion to the signal level that exists when the intermodulation distortion level is equal to the noise floor. To obtain a dynamic range of approximately 100 dB in a 1 Hz bandwidth, a 20 GHz photodiode with a typical quantum efficiency of no better than about 70% would have to endure average optical powers on the order of 10 mW or higher.

The power handling capability of a photodiode depends upon the area of its semiconductor junction, since too large a current density passing through the junction can lead to catastrophic failure. However, the photodetector's junction area is also a function of the frequency bandwidth required for the fiber optic link, because of an RC time constant associated with the capacitance of the photodetector's depletion layer. The achievement of high bandwidths requires smaller detectors, as well as thinner intrinsic layers within the detectors, and this results in lower optical power handling capabilities.

The present invention distributes an array of high speed photodetectors along an optical channel, preferably an optical waveguide, with the photocurrents produced by the individual detectors summed along a microwave transmission line. Generally equal fractions of the total optical power are preferably coupled into each of the individual detectors, so that the maximum total optical power that can be detected by the overall array is directly proportional to the number of detectors it includes. The dynamic range of the fiber optic link thus need no longer be limited by the maximum available photocurrent from any individual detector. In addition, since each photodetector receives only a fraction of the total optical power, the signal distortion produced by the overall array is less than what would be produced by a single detector.

Figure 1:
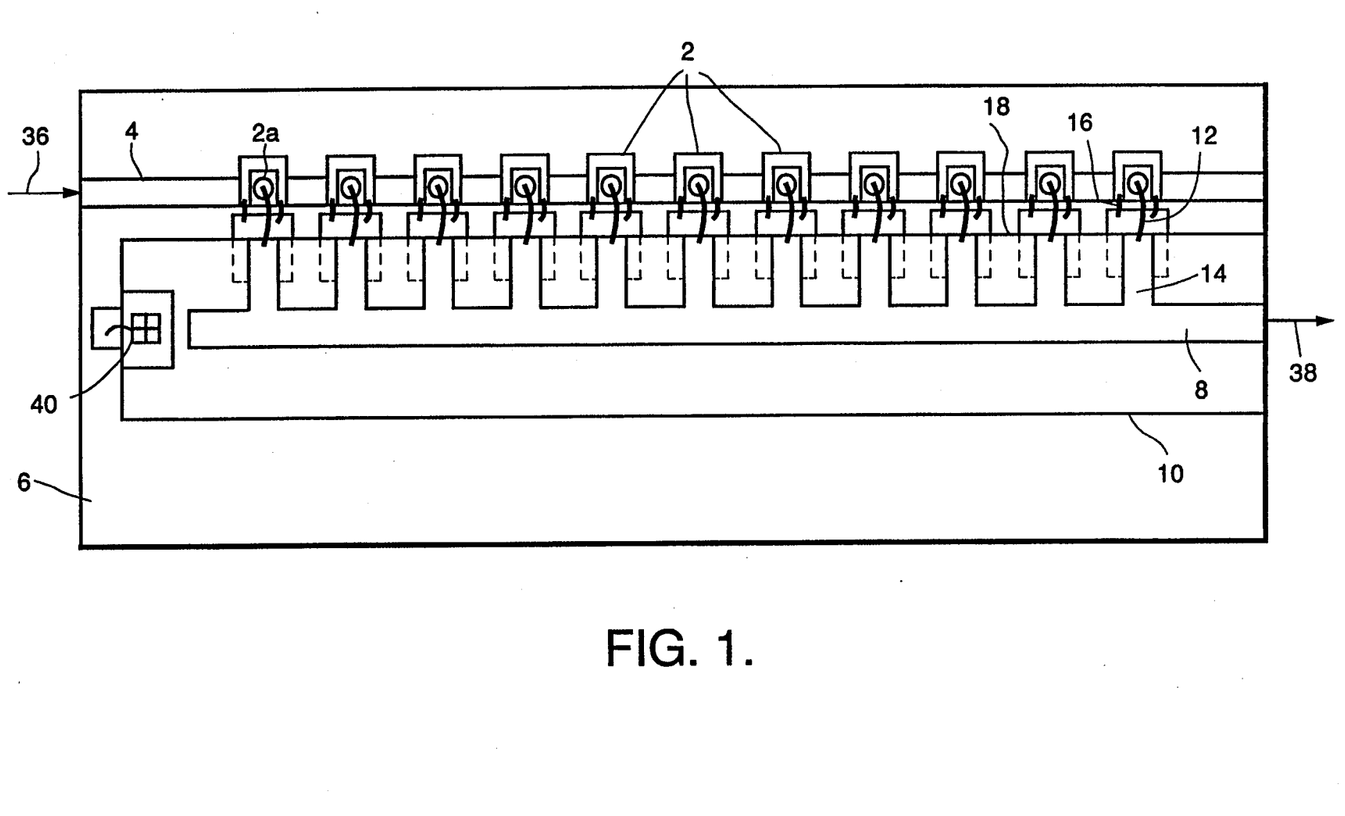
FIG. 1 is a plan view of a distributed optical receiver in accordance with the invention.

A first embodiment of the invention is shown in FIG. 1. An array of photodiodes 2 is fabricated over an integrated optical waveguide 4 on a substrate 6. Numerous different waveguide and substrate materials can be used, such as titanium waveguide strips diffused into a lithium niobate substrate, or a GaAs guiding layer between AlGaAs cladding layers on a GaAs substrate.

The photodiodes 2 as shown in FIG. 1 are back-illuminated, and are distributed at periodic intervals along the optical waveguide 4. The spacing between successive photodiodes is an important factor in the successful operation of the invention, and is discussed below.

Running alongside the optical waveguide 4 and photodetector array is a microstrip electrical transmission line 8 that is fabricated on a microwave substrate 10 such as quartz, GaAs, or a glass microfiber reinforced polytetrafluoroethylene composite such as the RF/duroid ® material produced by the Rogers Corporation. While a wide variety of optical waveguide and microwave substrates can be used, the effective optical index of refraction $n_o$ in the waveguide channel should be larger than the effective microwave index of refraction $n_m$ in the microstrip transmission line. This results in the optical signal propagating through the waveguide at a lower speed than an electrical signal in the bare microstrip transmission line. As explained below, the microstrip line is deliberately capacitively loaded so that its speed of electrical propagation matches the optical propagation speed within the waveguide, thus enabling a coherent accumulation of optically induced electrical signals from the photodetectors.

The individual photodiodes 2 are attached to the microstrip line 8 by respective bond wires 12 from one contact of each photodiode to short respective microstrip stub lines 14 that connect to the microstrip line 8, and by second respective bond wires 16 from the other photodiode contacts to the ground plane 18 on the underside of the microstrip line substrate. This latter connection requires bending the ground plane bond wire connections from the tops of the photodiodes to the bottom of the microwave substrate.

Figure 2:
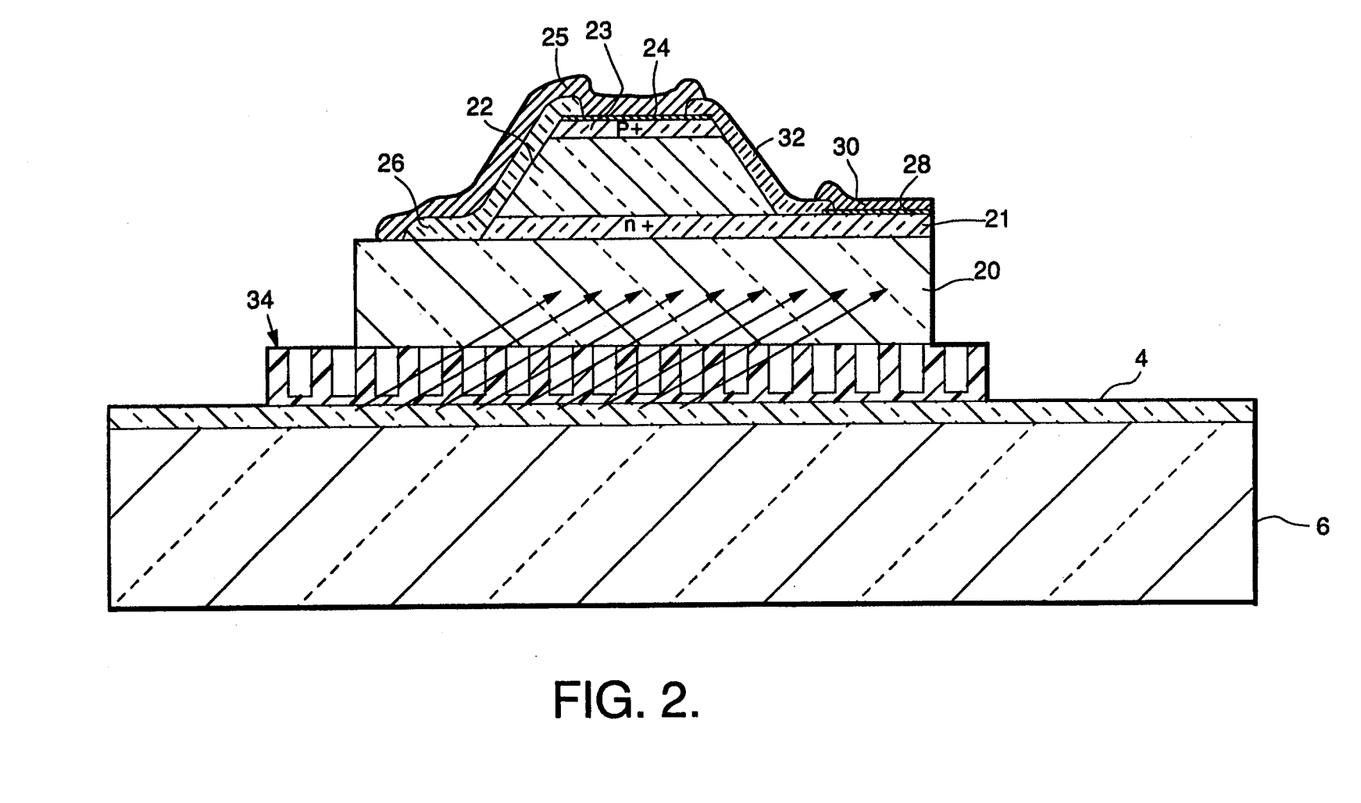
FIG. 2 is a sectional view of a p-i-n photodetector used in the embodiment of FIG. 1, and of a diffraction grating used to couple an optical signal into the photodetector.

The structure of one of the p-i-n photodiodes 2, as well as the manner in which a fraction of the optical signal is coupled into the detector, is shown in FIG. 2. The photodiode is formed on a semi-insulating InP substrate 20 and includes, in ascending order from the substrate, an n+ InP layer 21, an intrinsic GaAs depletion region 22 and a p+ InGaAs layer 23. An Au-Zn alloy p contact 24 is formed over p+ layer 23, with a signal brought out from the p contact by a Cr-Au alloy metallization 25 that is insulated from the n+, intrinsic and p+ layers 21, 22, 23 by a layer of polyimide 26. Electrical contact to the n+ layer 21 is established through an Au-Ge alloy n contact 28 and a Cr-Au alloy metallization 30 that is insulated from the remainder of the device by a polyimide layer 32. The depletion layer capacitance resides in the intrinsic region 22 between the n+ and p+ layers 21 and 23. A diffraction grating 34 is formed over the waveguide 4, and couples light from the waveguide into the underside of the photodetector. The grating is selectively etched into a non-photo-absorbing material such as photoresist, $SiO_2$ or a polyimide.

The fraction of the total optical signal that is coupled into each photodetector depends upon the size and structure of the grating 34. Since the optical signal remaining within the waveguide is progressively reduced as it passes each photodetector, the grating for each successive photodetector in the direction of optical propagation is preferably increased in size so that optical signals of approximately equal magnitude enter each photodiode. With the optical power in the waveguide divided approximately equally between the various detectors (assuming each photodiode receives approximately the same amount of optical power from the waveguide), the aggregate optical power that can be detected by the array is the sum of the individual optical power capacities for the different photodetectors.

Referring back to FIG. 1, in the operation of the high power detector an optical signal 36 enters the integrated optic waveguide 4 from its left-hand end. All of the photodiodes 2 are reverse-biased for high speed operation. A fraction of the light is coupled into and absorbed by the first detector 2a, as determined by the diffraction grating grown on top of the waveguide at this location. Similar amounts of light are absorbed by each of the remaining photodetectors, with little or no light remaining in the waveguide after the last photodetector. The absorbed optical signals are converted to microwave signals at the p-i-n junctions of the photodiodes, and these signals enter the microstrip line 8 (preferably 50 ohms) through the short stub lines 14. The microwave signals from each of the photodetectors are collected in the microstrip line 8, and the resulting microwave signal 38 is fed out to the rest of the receiving system. A chip resistor 40 at the opposite end of the microstrip transmission line 8 is used to absorb any microwave leakage power travelling in the opposite direction from the output.

For the microwave signals from each of the photodetectors to sum coherently in the microstrip line 8, the velocity of the RF signal on the microstrip line must equal the velocity of the optical signal in the waveguide 4. In other words, the phase relationship between the optical signal and the accumulating microwave signal must remain constant as these signals propagate along their respective paths. To accomplish this, the microstrip transmission line 8 is capacitively loaded by the necessary amount to slow down the RF signal velocity so that it matches the optical signal velocity. While conceptually this capacitive loading could be implemented with discrete capacitors, the depletion layer capacitances associated with each photodetector are already shunted across the microstrip transmission line, and the photodetectors can be arranged so that these inherent capacitances supply the required loading.

For a set of photodiodes with given depletion layer capacitances, the capacitive loading on the microstrip transmission line and the amount the microwave signal is slowed will vary with the spacing between successive photodiodes. The manner in which this spacing is determined is outlined below by first considering the velocity of a microwave signal on the microstrip transmission line in the absence of a capacitive loading, then factoring in the effect of the photodiode depletion layer capacitances, and finally taking into account the capacitance associated with the microstrip stub lines 14.

The propagation constant $\beta_c$ for a capacitively loaded line is:

$$\beta_c = \omega \sqrt{L(C + C_d/d)} \tag{1}$$

where L and C are respectively the inductance and capacitance per unit length of the microstrip line, $C_d$ is the discrete depletion layer capacitance of an individual photodiode, and d is the distance between detectors. If the line is unloaded, then its characteristic impedance $Z_m$ is given by:

$$Z_m = \sqrt{\frac{L}{C}} \tag{2}$$

and the velocity of the microwave signal in the unloaded line $V_{mu}$ is:

$$v_{mu} = \frac{1}{\sqrt{LC}} = \frac{c}{n_m} \tag{3}$$

where c is the free space speed of light and $n_m$ is the effective microwave index of refraction.

In a capacitively loaded line, in which the RF velocity if slowed down by the added capacitance averaged over the period between detectors, the microwave velocity $v_{ml}$ is known to be:

$$v_{ml} = \frac{v_{mu}}{\sqrt{1 + \frac{C_d Z_m c}{d n_m}}}. \tag{4}$$

Assume that the optical signal propagates along the waveguide 4 with a velocity $v_o = c/n_o$, where $n_o$ is the optical index of refraction, and assume further that $v_o$ is less than $v_{mu}$. With a proper selection of the distance or period between successive photodiodes, the microwave signal can be slowed down by means of the depletion layer capacitance loadings so that $v_{ml} 32 v_o$.

For example, assume that the waveguide is fabricated in lithium niobate by titanium indiffusion, so that $n_o = 2.2$. Further assume that a 50 ohm microstrip line is fabricated on a quartz substrate having a relative permitivity $\epsilon_r = 3.8$. The microstrip line has an effective microwave dielectric constant of 2.99 for an effective index of refraction of 1.73 (see T. T. Ha, *Solid State Microwave Amplifier Design*, John Wiley and Sons, New York, 1981, page 291). It can be shown that a 20 GHz p-i-n photodiode has a radius of 30 microns, and an intrinsic layer thickness of 1.5 microns (see Bowers et al., "Millimetre-Waveguide-Mounted InGaAs Photodetectors", *Electronics Letters*, Vol 22, 1986, pages 633–635). Under these conditions, the depletion layer capacitance $C_d$ can be calculated at 50 fF from the relationship $C = \epsilon_r A/t$, where A is the diode junction area, t is the intrinsic layer thickness, and $\epsilon_r$ is approximately 12 for InGaAs. Then, from the above equation for $v_{ml}$ and the relationships $v_o = c/n_o$ and $v_{mu} = c/n_m$, the period d between successive photodiodes for a velocity match at which $v_{ml} = v_o$ is given by:

$$d = \frac{C_d Z_m c}{n_m \left[\left(\frac{n_o}{n_m}\right)^2 - 1\right]}. \quad (5)$$

Thus, when the microstrip line is fabricated in quartz, the spacing between detectors should be 0.70 mm. If a 40 GHz photodetector is desired rather than a 20 GHz device, the photodiode radius can be determined to be approximately 5 microns and the intrinsic layer thickness about 0.5 microns. With these parameters, the depletion layer capacitance is 16.7 fF, and the period d can be calculated to be 0.23 mm.

If the integrated optic waveguide and the microstrip transmission line are both fabricated in InGaAs, then the optical index of refraction is equal to the microwave index of refraction, and a 50 ohm microstrip line would have an effective dielectric constant of 7.85 for an effective microwave refractive index $n_m$ of 2.80. In this case, for 40 GHz photodiodes the periodicity of the detectors can be calculated to be 0.168 mm. Fabricating the microstrip line from the same InGaAs as the detectors implies a monolithic structure that is described below in connection with FIGS. 5 and 6.

The effect of the microstrip line stubs 14 is to add a frequency dependent capacitance in parallel with the depletion layer capacitances. The effective capacitance $C_{eff}$ loading the microstrip line can be given in terms of admittance Y as follows:

$$C_{eff} = \frac{Y_s}{\omega} \frac{\omega C_d \cos \beta_s l + Y_s \sin \beta_s l}{Y_s \cos \beta_s l - \omega C_d \sin \beta_s l}, \quad (6)$$

where $Y_s = 1/Z_s$, $Z_s$ is the characteristic impedance of the stub lines (which is equal to $Z_m$ if the widths of the stub lines and the microstrip transmission lines are equal), $\beta_s \omega n_m/c$ is the propagation constant of the stub lines (which is equal to the propagation constant of the unloaded microstrip line if the widths of the stub lines and the microstrip transmission line are equal), and 1 is the stub length.

The equation for $C_{eff}$ was programmed to determine the frequency dependence of the effective capacitance for the case of an integrated optic waveguide fabricated in lithium niobate and a microstrip transmission line fabricated in quartz, with 16.7 fF photodetector depletion layer capacitances and 1 mm long microstrip stubs. The effective capacitance increased with frequency, but up to 20 GHz the effective capacitance remain within 4.5 fF of 87.5 fF. Accordingly, within this frequency range an inter-detector period of 1.16 mm can be expected to provide a broad band RF/optical velocity match (based upon a nominal effective capacitance of 87 fF). Above 20 GHz the frequency dependence of the effective capacitance becomes significant, ranging from 91.911 fF at 20 GHz to 137.190 fF at 40 GHz. Within this frequency range a bandpass response occurs, and the photodetector spacing would be determined for a center design frequency. This frequency dependence could be reduced by using short microstrip stub lines in a monolithic structure.

One approach to eliminating the microstrip stub lines is to wire bond the photodetectors directly to the RF stripline. With this variation, however, the bond wires would themselves introduce a certain degree of capacitance. Alternately, it may be possible to fabricate the RF line directly over the photodetectors in a flip-chip configuration, with the photodetectors electrically connected to the RF strip by means of indium "bump" connections. Such a configuration would considerably expand the potential bandwidth, which would basically be limited only by the detector parasitics. However, implementing a connection between the photodetector cathodes and the ground plane of the microstrip line could prove to be difficult.

Figure 3:
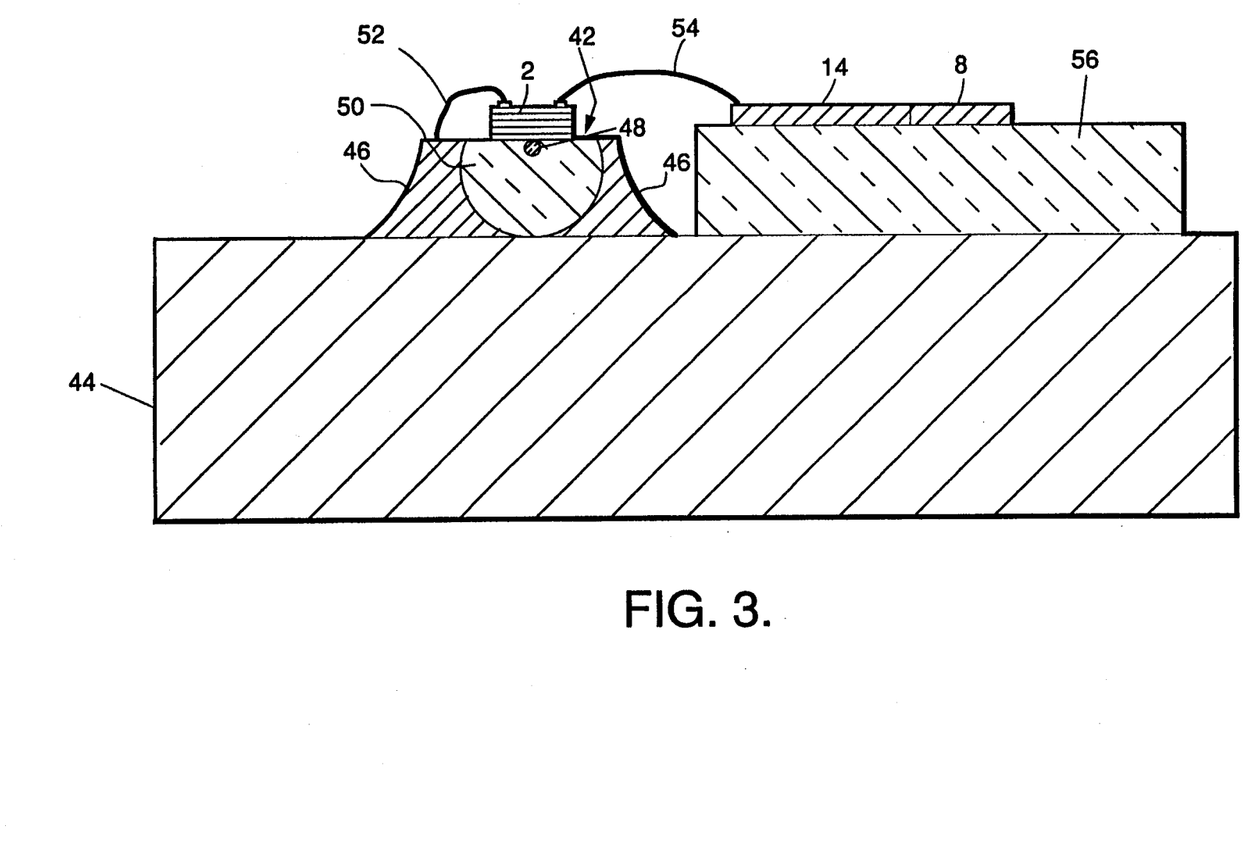
FIG. 3 is a sectional view of another embodiment in which photodetectors are provided over a truncated optical fiber.

In an alternate embodiment pictured in FIG. 3, the integrated optical waveguide is replaced by an optical fiber 42. All of the components are mounted on a conductive substrate, such as a copper carrier 44. The optical fiber 42 is held down to the carrier by means of up-plated copper sections 46; the up-plating process is described in U.S. Pat. No. 4,733,933, assigned to Hughes Aircraft Company, the assignee of the present invention. The optical fiber includes a core 48 and a surrounding cladding 50, and is truncated flat by polishing to within a few microns or less of the core. Photodetectors 2 are then attached to the fiber over its truncated section, using diffraction gratings if necessary to couple the light travelling through the core into the detectors. The detectors are connected to the carrier and to respective microstrip stub lines 14 with respective bond wires 52 and 54. As with the previous embodiment, the microwave signals from each photodetector are summed coherently along a microstrip line 8, which is fabricated on a separate microwave substrate 56.

Figure 4:
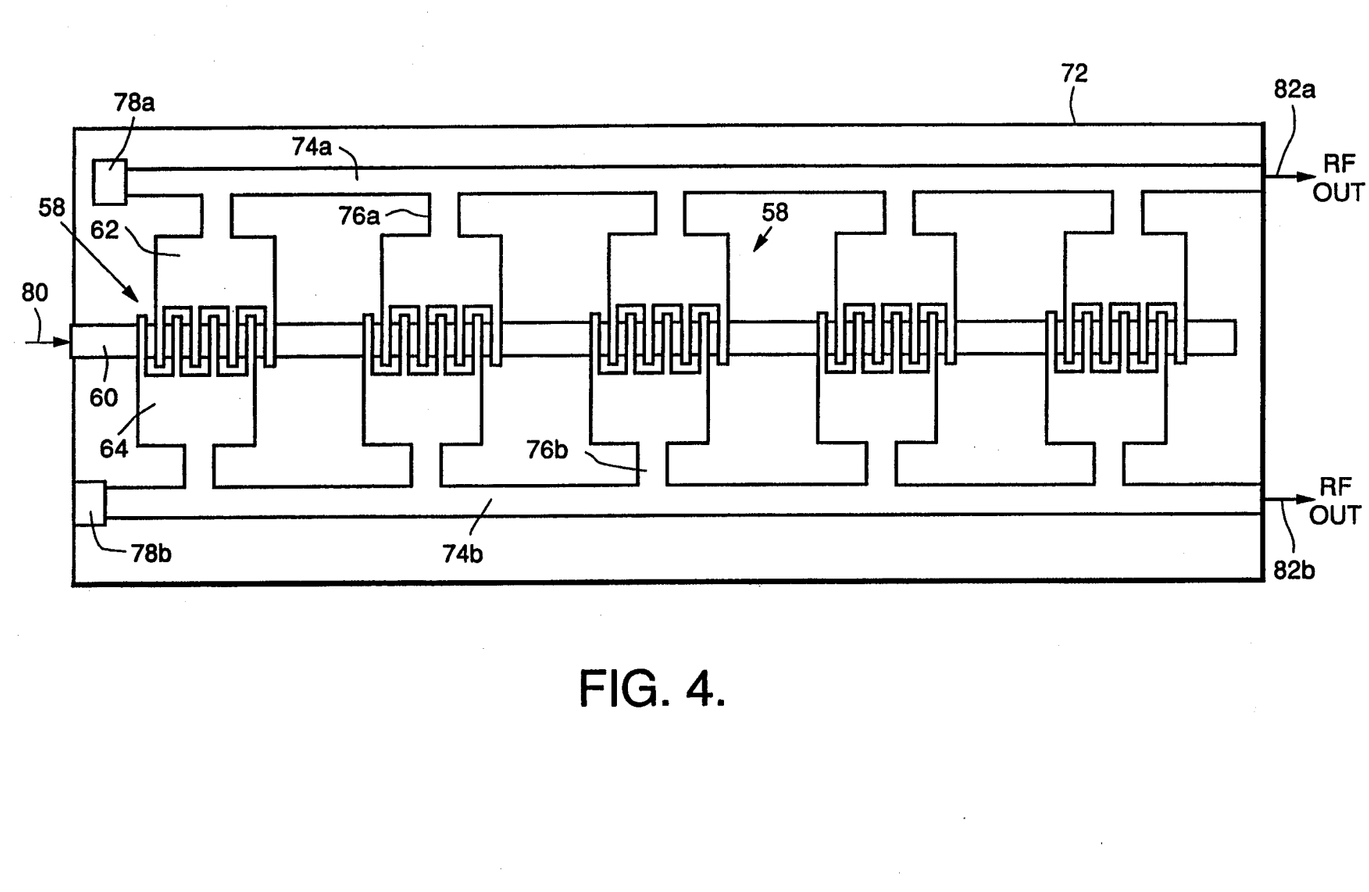
FIGS. 4 and 5 are respectively a plan view and a fragmentary perspective view of another embodiment in which photodetectors with interdigitated metal electrodes are distributed along a rib waveguide to both sample the waveguide's optical signal, and to add capacitances which produce a velocity-matching between the optical signal and the electrical signal accumulated from the photodetectors.
Figure 5:
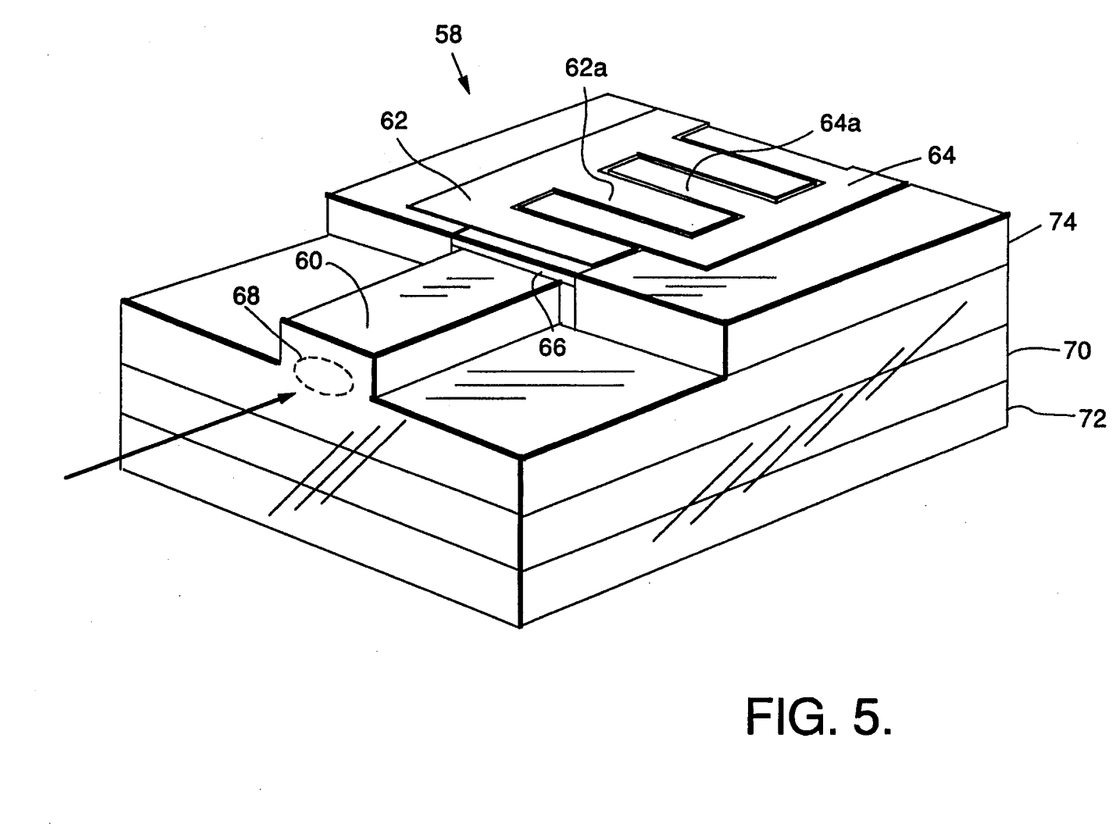

Another embodiment, in which a photodiode array is monolithically fabricated with a capacitively loaded microwave transmission line, is shown in FIGS. 4 and 5. Metal-semiconductor-metal photodetectors 58 are distributed along an optical transmission channel, which is preferably implemented as a rib waveguide 60, typically formed from InGaAs for a GaAs system. This type of photodetector is described in detail in U.S. patent application Ser. No. 07/800,663, Yap et al., filed Nov. 27, 1991, now U.S. Pat. No. 5,222,162, and assigned to Hughes Aircraft Company. Each photodetector consists of a pair of metal electrodes 62 and 64 on opposite sides of the waveguide, with interdigitated electrode fingers 62a and 64a extending over the rib waveguide 60. An active (optically absorbing) layer 66, typically InGaAs, directly overlies the waveguide, with the thin electrode metal evaporated onto the active layer. The rib structure confines the optical transmission path to an area 68 that is aligned with the rib, upward from a lower cladding layer 70. The assembly is fabricated on a semiconductor substrate 72, and a planarizing dielectric layer 74 would normally be provided along opposite sides of the rib 60 and active layer 66. An optical signal in the waveguide is coupled into the active absorbing layer, where it generates electrons and holes. A DC bias (not shown) is applied across the electrodes so that electrons are swept into one electrode and holes are swept into the other, replicating the amplitude modulated optical signal in the waveguide as an electrical signal in the electrodes.

A pair of metallized coplanar stripline electrical transmission lines 74a and 74b are provided on opposite sides of, and running parallel to, the waveguide. Metallized connectors 76a connect the electrodes 62 on one side of the waveguide to the stripline 74a, while another set of metallized connectors 76b connect the electrodes 64 on the opposite side of the waveguide to the stripline 74b. Matching resistors 78a and 78b are implanted at the left ends of striplines 74a and 74b, respectively, to absorb any microwave leakage energy that travels to the left as the main microwave signal exits the striplines to the right.

An optical signal 80 enters the waveguide from the left, and proceeds to the first MSM photodetector 58. Here a fraction of the optical signal is absorbed and converted to microwave energy. The amount of optical energy that is absorbed and converted at each MSM photodetector varies with the number and geometry of the electrode fingers employed. Assuming that most or all of the optical energy is absorbed over the length of the photodetector array, the number of electrode fingers in successive photodetectors may be increased to maintain a constant energy absorption at each successive photodetector as the amount of optical energy left in the waveguide progressively diminishes.

The electrode fingers also establish a distributed capacitive loading on the electrical transmission lines 74a and 74b. In general, the amount of capacitance associated with each MSM photodetector will vary with the number of electrode fingers employed. As with the previously described embodiments, the photodetectors are designed and spaced along the transmission lines to establish a velocity match between the electrical and optical signals; this in turn leads to a coherent accumulation of the microwave signals generated by each of the photodetectors along the lengths of the electrical transmission lines. The aggregate microwave signal exits the array on the right hand side, as indicated by arrows 82a and 82b. The optical waveguide 60 can be terminated after the last photodetector 58 if the photodetector coupling to the waveguide is such that substantially all of the optical energy is absorbed over the full photodiode array.

The described detector arrays make possible a large optical power capacity for detecting microwave signals without the signal distortion and limited bandwidth associated with individual high power photodetectors. For applications in the mm wave regime frequencies (greater than 30 GHz), the attainable powers are less but are still greater than could be achieved previously, and are sufficient to produce a usable output signal. While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A high power capacity optical receiver, comprising:
   an optical transmission channel,
   a plurality of opto-electric photodetectors distributed along said optical transmission channel to transduce respective portions of an optical signal propagating along said channel into respective electrical signals,
   an electrical transmission line with electrical input connections from said photodetectors distributed along said line, and
   a plurality of capacitance elements distributed along said electrical transmission line to adjust the speed at which electrical signals propagate along said line so that the electrical inputs from said photodetectors positively accumulate along said line.

2. The optical receiver of claim 1, wherein said electrical input connections are mutually spaced along said electrical transmission line and said capacitance elements are selected so that the electrical inputs from said photodetectors accumulate in phase with each other along said line.

3. The optical receiver of claim 2, wherein said electrical input connections are distributed along said electrical transmission line in the same relative sequence as their respective photodetectors are distributed along said optical transmission channel.

4. The optical receiver of claim 1, wherein said capacitance elements are included within said photodetectors.

5. The optical receiver of claim 4, wherein said photodetectors are mutually spaced along said optical transmission channel to achieve said adjustment in the electrical propagation speed along said electrical transmission line.

6. The optical receiver of claim 5, said optical transmission channel comprising an optical waveguide, and said photodetectors comprising p-i-n photodetectors having associated depletion layer capacitances to provide said capacitance elements.

7. The optical receiver of claim 5, said electrical transmission line comprising a microstrip RF line.

8. The optical receiver of claim 7, said electrical input connections from said photodetectors to said microstrip RF line comprising a plurality of microstrip stub lines.

9. The optical receiver of claim 8, wherein said stub lines add to the capacitance provided by said photodetectors, and said photodetectors are spaced from each other along said optical transmission line to account for the capacitances associated with both the photodetectors and said stub lines.

10. The optical receiver of claim 7, wherein said photodetectors overlie said microstrip RF line.

11. The optical receiver of claim 1, wherein diffraction gratings are distributed along said optical transmission channel to couple desired portions of the light from said channel into said photodetectors.

12. The optical receiver of claim 1, said optical transmission channel comprising an optical fiber having a core and a cladding, with the cladding truncated along one side substantially to the level of the core, and said photodetectors overlying the core on the truncated side of the cladding.

13. The optical receiver of claim 1, said optical transmission channel comprising a waveguide with a semiconductor active layer, and said photodetectors comprising metal-semiconductor-metal devices having opposed pairs of metal electrodes with interdigitated electrode fingers that overlie an optical active absorbing layer over said optical transmission channel.

14. The optical receiver of claim 13, said optical transmission channel comprising a rib waveguide.

15. The optical receiver of claim 1, wherein optical coupling elements are distributed along said optical transmission channel to couple generally equal portions of an optical signal propagating along said channel to said photodetectors.

16. A method of transducing an optical signal into an electrical signal, comprising:
   tapping the optical signal at distributed locations along an optical transmission path, converting the tapped optical signals into respective electrical signals,
accumulating said electrical signals sequentially along an electrical transmission path into an output signal, and
delaying the propagation of the accumulating output signal along said electrical transmission path so that said electrical signals accumulate coherently.

17. The method of claim 16, wherein said signal delay is implemented by distributing capacitive elements along said electrical transmission path.

18. The method of claim 17, wherein photodetectors are used to convert said tapped optical signals into said electrical signals, said photodetectors having inherent capacitances that provide said capacitive elements.

* * * * *